US005717471A

United States Patent [19]

Stewart

[11] Patent Number: 5,717,471
[45] Date of Patent: Feb. 10, 1998

[54] APPARATUS FOR DEMODULATING AND DECODING SATELLITE, TERRESTRIAL AND CABLE TRANSMITTED DIGITAL TELEVISION DATA

[75] Inventor: John Sidney Stewart, Indianapolis, Ind.

[73] Assignee: Thomson Consumer Electronics, Inc., Indianapolis, Ind.

[21] Appl. No.: 501,752

[22] Filed: Jul. 12, 1995

Related U.S. Application Data

[62] Division of Ser. No. 342,280, Nov. 18, 1994, Pat. No. 5,497,401.

[51] Int. Cl.[6] .................................................. H04N 9/68
[52] U.S. Cl. .................... 348/726; 348/558; 348/555; 375/260; 375/265; 375/340
[58] Field of Search .................................. 348/726, 725, 348/558, 555, 638; 375/260, 262, 265, 240, 287, 332, 340, 341; H04N 9/68

[56] References Cited

U.S. PATENT DOCUMENTS

| | | | |
|---|---|---|---|
| 4,309,719 | 1/1982 | Hinn | 358/21 R |
| 5,119,177 | 6/1992 | Lim | 358/21 R |
| 5,233,630 | 8/1993 | Wolf | 375/67 |
| 5,253,044 | 10/1993 | Lamy | 358/21 R |
| 5,267,024 | 11/1993 | Murayama | 358/26 |
| 5,282,019 | 1/1994 | Basile et al. | 358/12 |
| 5,434,886 | 7/1995 | Kazawa et al. | 375/262 |
| 5,444,491 | 8/1995 | Lim | 348/441 |
| 5,497,401 | 3/1996 | Ramaswamy et al. | 375/341 |
| 5,511,096 | 4/1996 | Huang et al. | 375/265 |

FOREIGN PATENT DOCUMENTS

| | | | |
|---|---|---|---|
| 0 681 400 | 11/1995 | European Pat. Off. | H04N 7/00 |
| WO94/28656 | 12/1994 | WIPO | H04L 1/00 |
| WO95/15656 | 6/1995 | WIPO | H04N 7/16 |
| WO96/02100 | 1/1996 | WIPO | G04L 25/03 |

OTHER PUBLICATIONS

"Concept of a European System for the Transmission of Digitized Television Signals Via Satellite" by U. Reimers, SMPTE Journal, vol. 103, No. 11, 1 Nov. 1994, pp. 741–747.

"A Flexible Bit–Rate Transmission System for Digital HDTV Outside Broadcasting by Satellite", by A. Morello, I.E.E.E. Proceedings of the Global Telecommunications Conference (Globecom), vol. 3 of 4, pp. 1622–1627, 29 Nov. 1993.

"Digital Video Compression and Transmission Common Elements for cable, Satellites and Terrestrial Networks?", by L. Stenger, Postes: Telephones et Telegraphes Suisses, No. SYMP. 18, pp. 444–457, 11 Jun. 1993.

"Multirate All–Digital Model for Support of Universal Multiplex Transport Layer for Digital Compression", by F. Harris et al., Proceedings from Eleven Technical Sessions of the Annual Convention and Exposition of the National Cable Television Association, No. Convention 42, pp. 289–293, 6 Jun. 1993.

"A 45–Mbit/sec. VLSI Viterbi Decoder for Digital Video Applications", by G. Edwards, I.E.E.E. Commercial Applications and Dual Use Technology, No. –, pp. 127–130, 16 Jun. 1993.

*Primary Examiner*—Glenton B. Burgess
*Attorney, Agent, or Firm*—Joseph S. Tripoli; Ronald H. Kurdyla; Alexander J. Burke

[57] ABSTRACT

A Digital signal processor selectively demodulates and decodes signals received from multiple types of transmission channels such as satellite, terrestrial and cable transmission channels. A received signal is representative of compressed digital video information such as television picture information, and is encoded in one of a plurality of coding formats (e.g., trellis or punctured codes of selectable code rate). The received signal is also modulated in one of a plurality of modulation formats (e.g., PAM, QAM or PSK). A demodulator selectively demodulates the signal modulated in one of the plurality of modulation formats, and a decoder selectively decodes the demodulated signal coded in one of the plurality of coding formats.

14 Claims, 5 Drawing Sheets

APPARATUS FOR DEMODULATING AND DECODING SATELLITE, TERRESTRIAL AND CABLE TRANSMITTED DIGITAL TELEVISION DATA

This application is a division of application Ser. No. 08/342,280, by J. S. Stewart et al, filed Nov. 18th 1994, U.S. Pat. No. 5,497,401.

FIELD OF INVENTION

The invention is related to the field of digital signal processing apparatus suitable for use in a multi-channel receiver of satellite, terrestrial and cable transmitted digital television data.

BACKGROUND OF THE INVENTION

Known in the art is the use of forward-error-correction that includes convolutional encoding in the transmission of encoded digital data over a noisy channel from a transmitter to a receiver that includes a branch metric computer for a Viterbi-algorithm based convolutional decoder. The Viterbi Algorithm is used very commonly to decode a convolutionally encoded sequence of bits transmitted over a noisy channel. In the heart of the Viterbi algorithm is a series of repetitive add-compare-select operations which accept as input certain metrics (termed branch metrics) computed on each received symbol from the demodulator. For satellite, cable and terrestrial transmission of high data rate signals, such computations need to performed at very high rates. Furthermore, in a modem/decoder operating over different channels with different (but related) coding schemes, the cost of computing the branch metrics becomes excessive in terms of lookup table memory or actual hardware to perform these computations.

In the case of a satellite transmission channel, it is customary to transmit some particular punctured quaternary phase shift keyed (QPSK) code known to the receiver's convolutional decoder. In the case of a terrestrial or cable transmission channel, some particular pragmatic trellis code (such as quadrature amplitude modulation (QAM), phase amplitude modulation (PAM) or phase shift keyed (PSK) code) known to the receiver's convolutional decoder. For instance, the prior art discloses the use of a pragmatic trellis code as a practical code for QAM transmission of high definition television (HDTV).

In the past, the receiver including a branch metric computer for a Viterbi-algorithm based convolutional decoder was typically designed to operate with only a single predetermined type of convolutional code. However, it is likely that multi-channel digital television receivers will enter the mass-produced market in the near future and, over time, replace currently-used analog television receivers. Direct broadcast satellite transmission to television receivers is already available in addition to terrestrial and cable transmission thereto. Therefore, it is desirable that the convolutional decoders of such multi-channel digital television receivers be selectively responsive to the type of code (either punctured or pragmatic trellis, as the case may be) and the type of modulation (PSK including both QPSK and 8-PSK, PAM or QAM, as the case may be) of the channel then being received by the multi-channel digital television receiver. Further, mass-produced television receivers should be designed with reduction in cost and complexity in mind.

SUMMARY OF THE INVENTION

The inventor has recognized that a single signal processing device can advantageously accommodate multiple demodulation and decoding functions within the context of a digital television signal processing system, for example. In accordance with the principles of the invention, disclosed digital signal processing apparatus provides selective demodulation and decoding elements incorporating different types of demodulation and decoding functions. As a result, a single signal processing network may demodulate and decode signals of different signal format such as satellite, terrestrial and cable television signals, for example.

In a system for receiving a modulated video signal, from multiple types of transmission channels, apparatus in accordance with the principles of the present invention provides a demodulated and decoded output signal. The received video signal is representative of compressed digital video information such as television picture information, and is encoded in one of a plurality of coding formats. The received video signal is also modulated in one of a plurality of modulation formats. The apparatus includes a demodulator for selectively demodulating the received video signal modulated in one of the plurality of modulation formats to provide a demodulated signal.

The apparatus also includes a decoder for selectively decoding the demodulated signal coded in one of the plurality of coding formats.

In accordance with a feature of the invention, the demodulator selectively demodulates the video signal modulated by Pulse Amplitude Modulation (PAM), Quadrature Amplitude Modulation (QAM) or Phase Shift Keying (PSK).

In accordance with another feature of the invention the selective decoder decodes the demodulated signal coded in trellis or punctured code format.

In a further feature of the invention, the selective decoder decodes the demodulated signal with a code rate selected from a plurality of code rates.

DESCRIPTION OF THE PREFERRED EMBODIMENT

Figure 1:
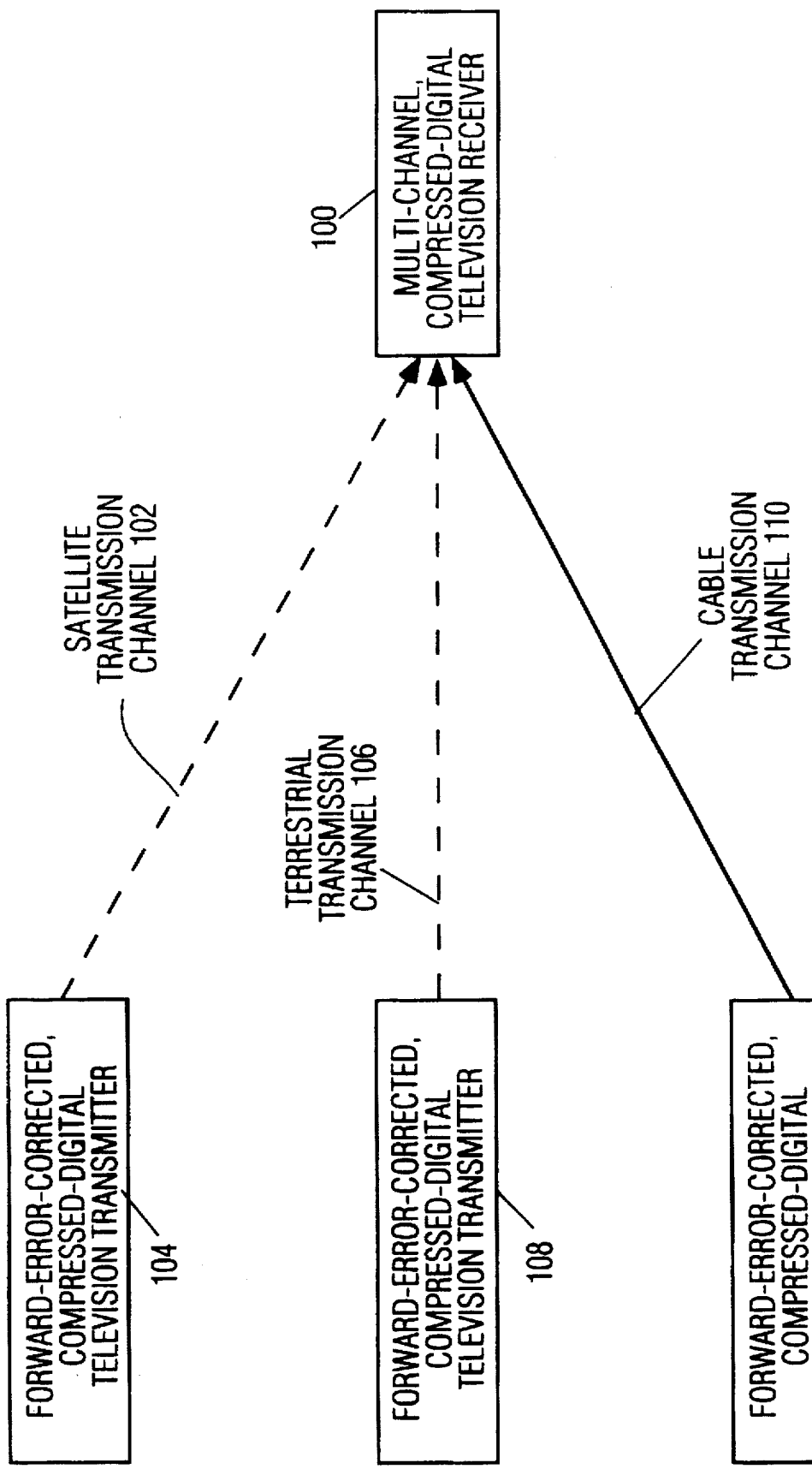
FIG. 1 illustrates the different types of transmission channels which may be received by a multi-channel compressed-digital television receiver transmitted from a forward-error-corrected compressed-digital television transmitter.

As shown in FIG. 1, multi-channel compressed-digital television receiver 100 is capable of selectively receiving digitally-encoded television data transmitted over each of a plurality of different channels. These plurality of channels include satellite transmission channel 102, which transmits digitally-encoded television data from forward-error-corrected television transmitter 104; terrestrial transmission channel 106, which transmits digitally-encoded television data from forward-error-corrected television transmitter 108; and cable transmission channel 110, which transmits digitally-encoded television data from forward-error-corrected television transmitter 112. As known in the art, forward-error-correction at the transmitter typically comprises convolutional encoding of successively-transmitted symbol packets of already encoded compressed-digital television data.

As further known in the art, while QSPK-based punctured codes are typically employed for transmission of convolutional encoded data over a satellite channel, higher alphabet (i.e., 8, 16, 32, 64, 128 and 256) n/n+1 pragmatic trellis codes are typically employed for PAM, PSK or QAM based transmission of convolutional encoded data over terrestrial or cable channels. Therefore, it is required that multichannel receiver 100 incorporates a convolutional decoder that is capable of decoding any particular one of QSPK-based punctured or PAM, PSK or QAM based higher alphabet n/n+1 pragmatic trellis codes, depending on the selected one of the multi-channels then being received.

Figure 2:
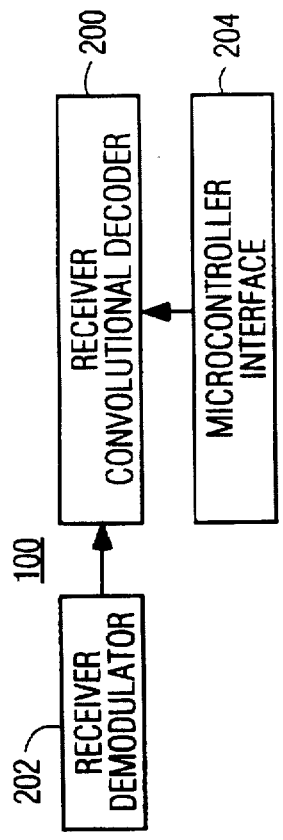
FIG. 2 is a block diagram showing the relationship among the convolutional decoder, the demodulator applying an input to the decoder, and a microcontroller interface to the decoder of the multi-channel compressed-digital television receiver of FIG. 1.

More specifically, multi-channel receiver 100 comprises digital processing apparatus which, as shown in FIG. 2, includes receiver convolutional decoder 200 and receiver demodulator 202 which, as known in the art, applies each of a series of successively-received convolutionally-encoded symbol packets as the signal input data to receiver convolutional decoder 200. Each successively-received symbol packet of this data defines a point in the in-phase (I), quadrature-phase (Q) plane. The digital processing apparatus of multi-channel receiver 100 further comprises a microcontroller which includes microcontroller interface 204 for applying a control input to receiver convolutional decoder 200.

Figure 3:
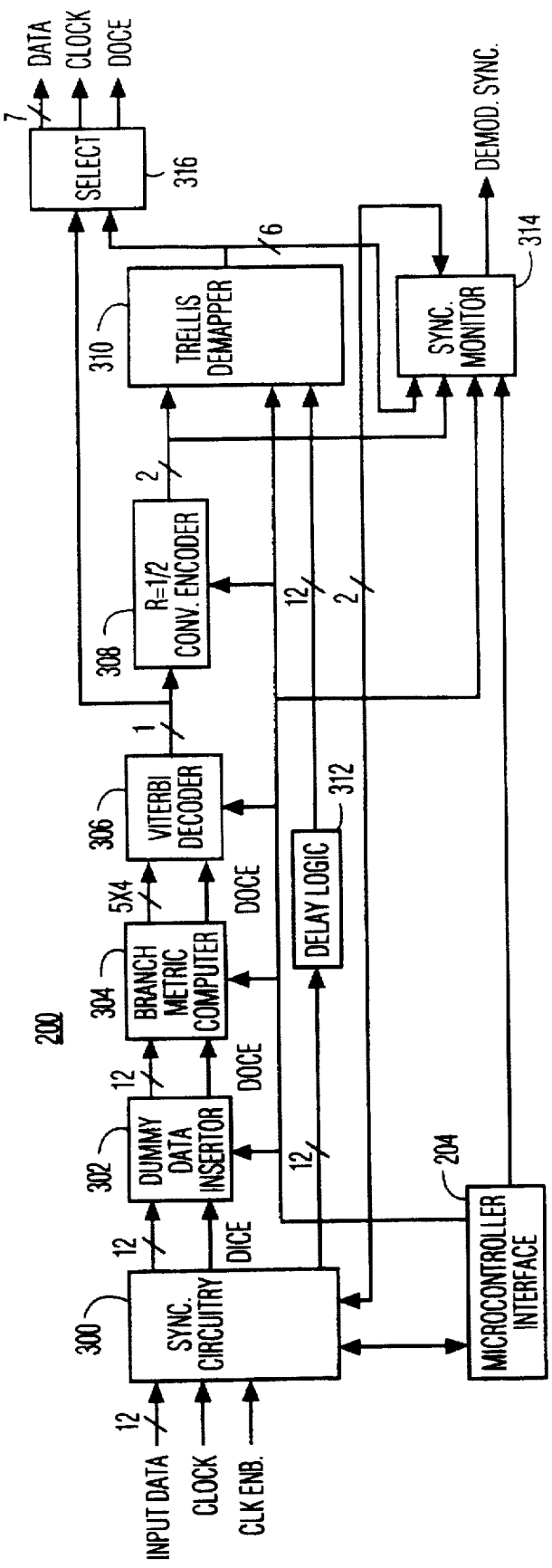
FIG. 3 is a block diagram of the structural elements of the convolutional decoder shown in FIG. 2 which shows the coupling of the microcontroller interface of FIG. 2 to the structural elements of the convolutional decoder.
Figure 3A:
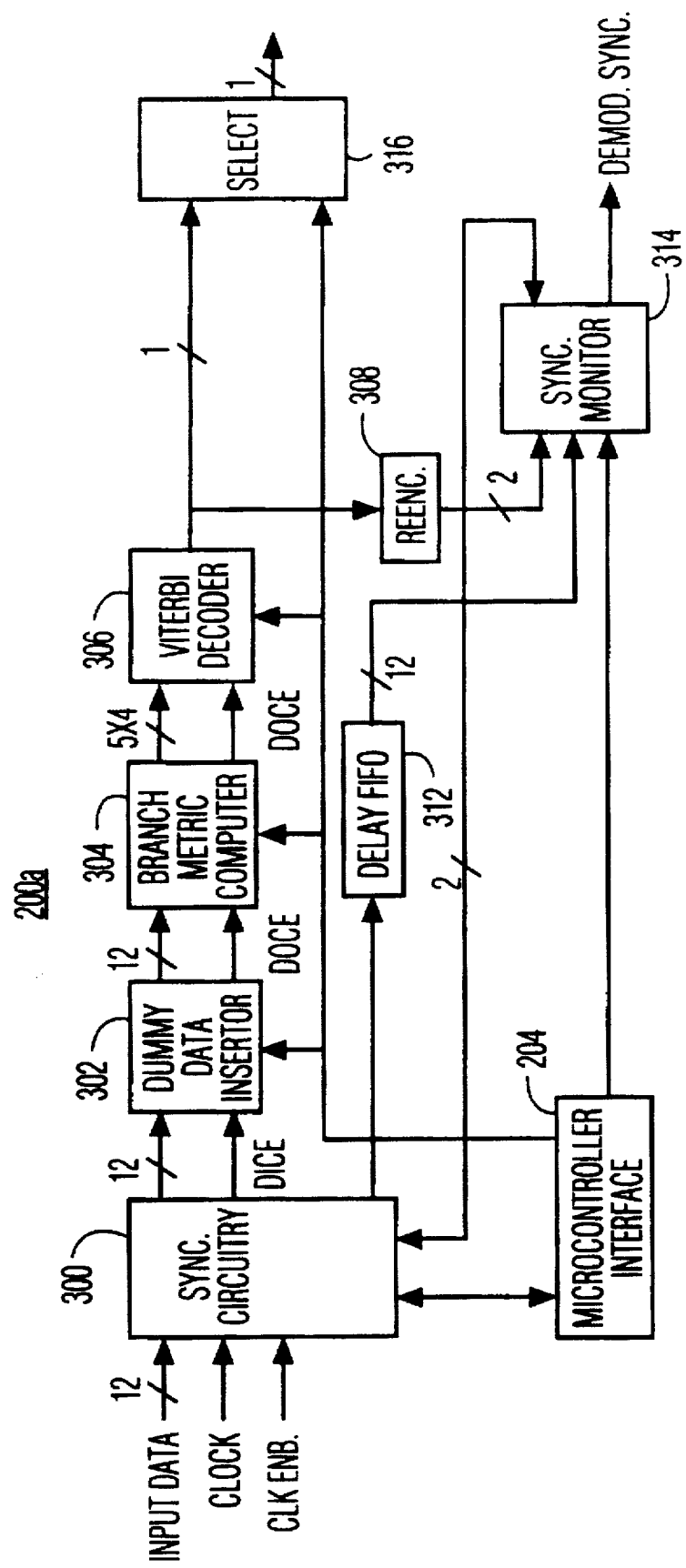
FIG. 3a is a functional diagram of the operative elements of the convolutional decoder shown in FIG. 3 when programmed by the microcontroller interface of FIG. 3 to operate in a punctured code decoding mode.
Figure 3B:
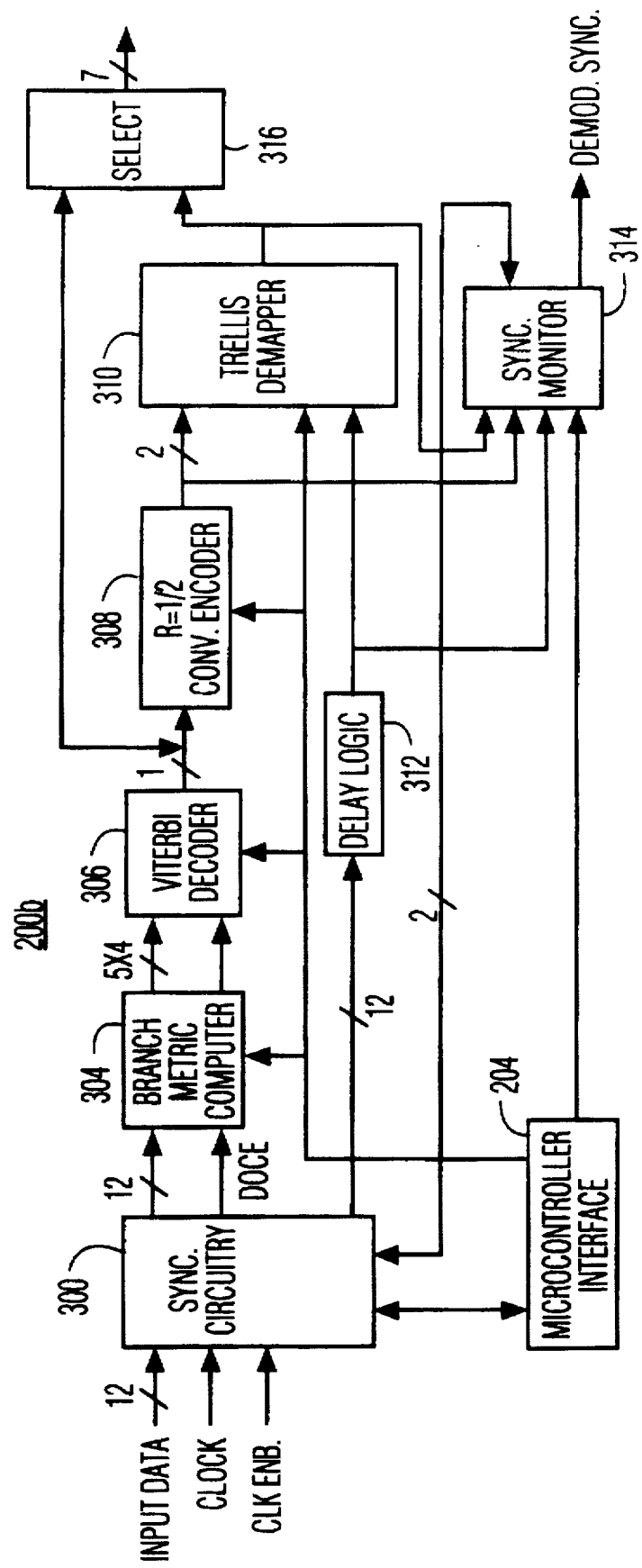
FIG. 3b is a functional diagram of the operative elements of the convolutional decoder shown in FIG. 3 when programmed by the microcontroller interface of FIG. 3 to operate in a pragmatic trellis code decoding mode.

The relationship among the structural elements of receiver convolutional decoder 200 employed by the present invention, and the control of these elements by external microcontroller interface 204, is shown in FIG. 3. As shown in FIG. 3, the structural elements of receiver convolutional decoder 200 include synchronization circuitry 300, dummy data insertor 302, branch metric computer 304, Viterbi decoder 306, convolutional encoder 308, trellis demapper 310, delay logic 312, synchronization monitor 314 and select means 316. Microcontroller interface 204 provides a list of specifications to the aforesaid structural elements which configures the operation of the convolutional encoder as either a decoder for punctured codes or, alternatively, as a decoder for trellis decodes. FIGS. 3a and 3b, respectively, show the manner in which the elements of the convolutional decoder shown in FIG. 3 are (1) configured for operation as a decoder for punctured codes or (2) configured for operation as a decoder for trellis codes.

The output data from demodulator 202 is applied as I,Q input data to synchronization circuitry 300. For illustrative purposes, it is assumed that each of the I and Q data is by 6 bits (i.e., the input data is applied over a total of 12 parallel input conductors). This permits each of 64×64=4096 distinct points in the I,Q plane to be defined by the 6-bit I and 6-bit Q components of the 12-bit input data. Synchronization circuitry 300 also receives clock and clock-enable (Clk Enb) inputs thereto. In addition, synchronization circuitry 300 both receives control data from microcontroller interface 204 and supplies data thereto, and is directly coupled to synchronization monitor 314.

Each of elements 302, 304, 306, 308 and 310 has control data applied thereto from microcontroller interface 204. Further, although not shown in FIG. 3, the clock is applied to these elements. Properly synchronized I and Q data is forwarded from synchronization circuitry 300 through dummy data insertor 302 to branch metric computer 304 in response to data input clock enable (DICE) and data output clock enable (DOCE). Further, the properly synchronized I and Q data is forwarded through delay logic 312 to trellis demapper 310 and synchronization monitor 314.

Dummy data insertor 302 is primarily used for punctured codes and is responsible for the insertion of the dummy data corresponding to a specified deletion map for such punctured codes. For trellis codes, dummy data insertor 302 merely passes through its input data to its output. The choice of code and the corresponding deletion map are conveyed to dummy data insertor 302 via microcontroller interface 204. Dummy data insertor 302 clocks data out with an internal clock at a rate which depends on the coding scheme employed. Since the input and output data rates are different (for punctured codes), the data input clock enable (DICE) and the data output clock enable (DOCE) signals are unique. The DICE signal is the clock enable from receiver demodulator 202, while the DOCE signal is generated internally in dummy data insertor 302 (and is derived from the clock signal). Specifically, dummy data insertor 302 consists of a FIFO storage mechanism, a write clock to write in the soft decision samples in appropriate locations, and a read clock (which operates at a rate higher than the write clock and depends on the punctured coding used for its clocking rate) to read out the data for branch metric computations. The dummy samples are also inserted in appropriate locations before being read out.

Figure 4:
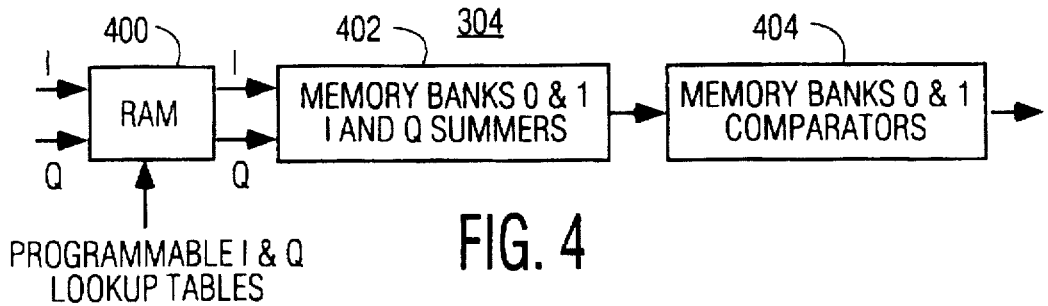
FIG. 4 is a block diagram of the structural elements of the branch metric computer shown in FIG. 3.

Branch metric computer 3044 (the details of which are discussed below in FIGS. 4 and 4a) derives 4 separate 5-bit outputs in response to each of successively-received symbol packets. These 4 separate 5-bit outputs and the DOCE signal from branch metric computer 304 are applied as inputs to Viterbi decoder 306. Viterbi decoder 306, which is a Rate R=½, constraint length k=7 decoder, performs the Viterbi algorithm for punctured and trellis codes, wherein the 5-bit metric inputs from branch metric computer 306 are used to update the states and to make bit decisions. Viterbi decoder 306 employs add-compare-select (ACS) means, path metric storage means, and the memory for the survivor paths at each level in the trellis. In addition, Viterbi decoder 306 also takes care of metric renormalizations to avoid a buildup and overflow of the accumulated metrics.

A 1-bit output from Viterbi decoder 306 is applied as an input to convolutional encoder 308. For trellis and punctured codes, convolutional encoder 308 serves to regenerate the best estimates of the two transmitted of the rate ½ embedded code. The output from encoder 308 is also applied to synchronization monitor 314 for use in checking the synchronization status of punctured codes. In addition, the 1-bit output from Viterbi decoder 306 is applied as an input to select means 316.

The 2-bit output from convolutional encoder 308 is applied to trellis demapper 310, which is responsible for making symbol decisions for the trellis-coded mode of operation shown in FIG. 3b. In the trellis coded mode of operation, trellis demapper 310 uses the 2-bit output from convolutional encoder 308 for subset selection together with the delayed I and Q received symbol data forwarded thereto through delay logic 312 to make these symbol decisions. A 6-bit output from trellis demapper 310 is applied as an input to both synchronization monitor 314 and select means 316.

Delay logic 312 accounts for the delay introduced by Viterbi decoder 306/encoder 308 and associated circuitry and synchronizes the data stream at the output of the encoder with the received symbol stream. Control input through microcontroller interface 204 selects one of 4 possible path memory lengths of Viterbi decoder 306 which is also used to appropriately select the delay time in delay logic 312.

Synchronization monitor 314, which is coupled to synchronization circuitry 300, the output from trellis demapper 310, encoder 308, the output from delay logic 312 and microcontroller interface 204, uses the branch metric information in conjunction with an observation interval specification from microcontroller interface 204 to decide the synchronization status. It also provides information to synchronization circuitry 300 for optional automatic synchronization. In an automatic synchronization mode of operation, the internal synchronization circuitry is employed to perform the synchronization function. Alternatively, the synchronization could be performed from external circuitry. Synchronization monitor 314 is also used to provide a signal to the demodulator for resolving phase ambiguities. This signal is used for only the purpose of accounting for phase ambiguities in receiver demodulator 202. Further, synchronization monitor 314 supplies a demodulated synchronization signal for use by downstream components of receiver 100.

Select means 316, which receives the 1-bit output of Viterbi decoder 306 and the 6-bit output of trellis demapper 310 applied as inputs thereto, forwards all of these 7 bits to its output when the convolutional decoder is operating in its trellis-code mode and forwards only the 1 bit from the output of Viterbi decoder 306 to its output when the convolutional decoder is operating in its punctured-code mode. This output data along with a clock and a DOCE signal are supplied from select means 316 for use by downstream components of receiver 100.

The structure of branch metric computer 304 comprises random access memory (RAM) 400, Memory banks 0 & 1 I and Q summers 402 and memory banks 0 & 1 I and Q comparators 404. RAM 400 may also be a read-only memory. RAM 400 is preloaded during an initialization phase with programmable, precomputed I and Q lookup tables from microcontroller interface 204 applied as a control input thereto. In response to I and Q signals forwarded from dummy data insertor 302 (which depunctures QPSK-based punctured coded symbols) to RAM 400 as signal inputs thereto, selected ones of the I and Q entries of these lookup tables are read out as outputs from RAM 400 and applied as inputs to memory banks 0 & 1 I and Q summers 402. The output from memory banks 0 & 1 I and Q summers 402 is applied as an input to memory banks 0 & 1 I and Q comparators 404, and the output from memory banks 0 & 1 I and Q comparators 404 is forwarded as an input to Viterbi decoder 306.

Figure 4A:
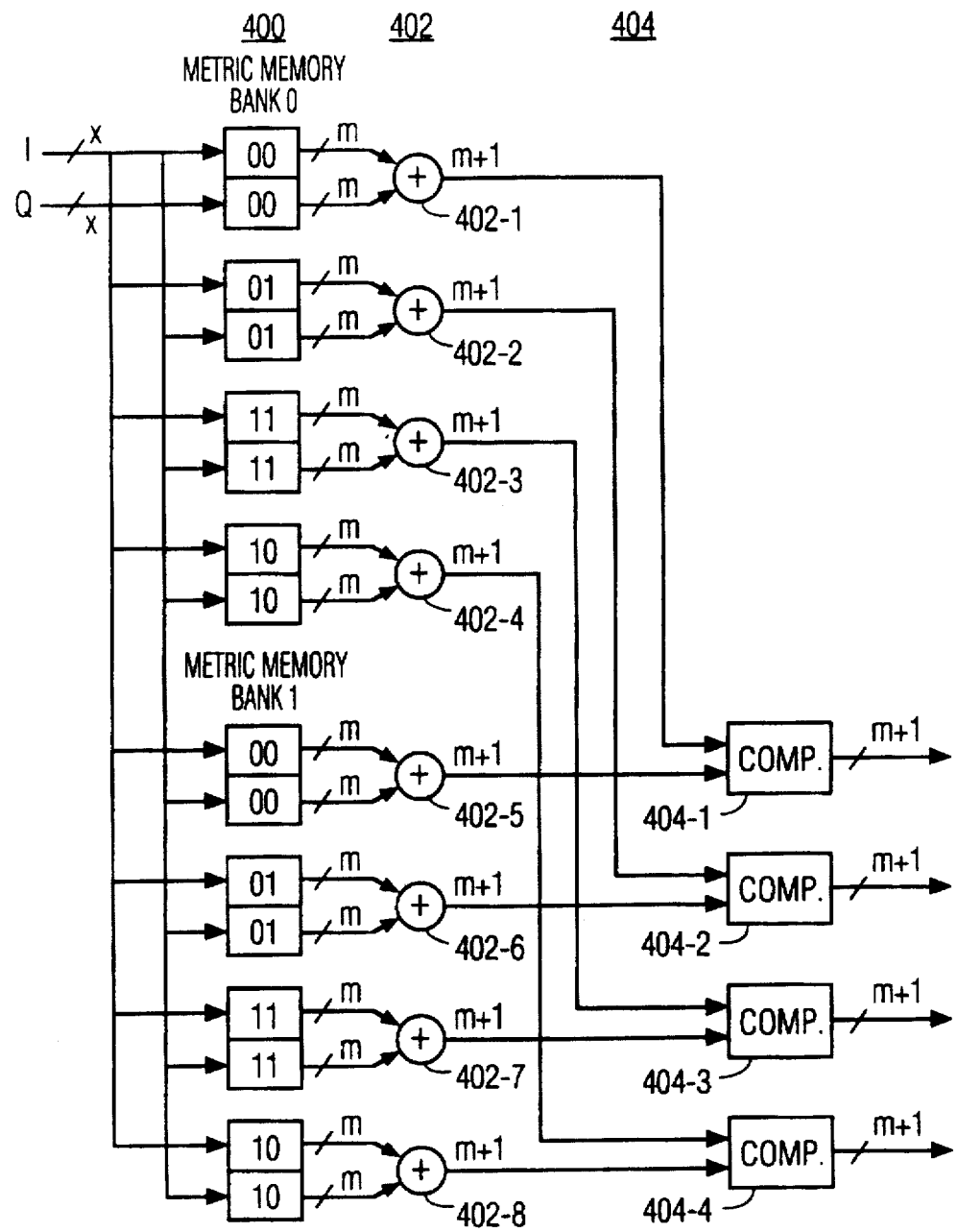
FIG. 4a illustrates the functional organization of the branch metric computer's structural elements shown in FIG. 4.

More specifically, as functionally shown in FIG. 4a, RAM 400 is organized into metric memory bank 0 and metric memory bank 1. Memory bank 0 is made up of a first pair of subsets comprising first I subset 00 and first Q subset 00; a second pair of subsets comprising second I subset 01 and second Q subset 01; a third pair of subsets comprising third I subset 11 and third Q subset 11; and a fourth pair of subsets comprising fourth I subset 10 and fourth Q subset 10. Memory bank 1 is also made up of 4 similar pairs of I and Q subsets, thereby providing a total of 8pairs of I and Q subsets for RAM 400. Each of the 8 I subsets receives the I signal input to RAM 400 and each of the 8 Q subsets receives the Q signal input to RAM 400. In general, each of the I and Q signal inputs is an x-bit signal (specifically assumed in the illustrative FIG. 3 example to be a 6-bit signal). Each of the 8 I subsets derives an m-bit signal output (illustratively assumed to be a 4-bit signal output) and each of the 8 Q subsets derives an m-bit signal output.

All of the 8 separate I and Q m-bit signal outputs from RAM 400 are forwarded as inputs to the respective summers of memory banks 0 & 1 I and Q summers 402. Specifically, the two outputs from the first pair of subsets of bank 0 are applied as first and second inputs to summer 402-1; the two outputs from the second pair of subsets of bank 0 are applied as first and second inputs to summer 402-2; the two outputs from the third pair of subsets of bank 0 are applied as first and second inputs to summer 402-3; the two outputs from the fourth pair of subsets of bank 0 are applied as first and second inputs to summer 402-4; the two outputs from the first pair of subsets of bank 1 are applied as first and second inputs to summer 402-5; the two outputs from the second pair of subsets of bank 1 are applied as first and second inputs to summer 402-6; the two outputs from the third pair of subsets of bank 1 are applied as first and second inputs to summer 402-7, and the two outputs from the fourth pair of subsets of bank 1 are applied as first and second inputs to summer 402-8. A separate (m+1)-bit output signal (i.e., 5-bit signal in the assumed case) is derived from each of these 8 summers.

All of the 8 separate (m+1)-bit output signals from the summers are forwarded as inputs to the respective comparators of memory banks 0 & 1 I and Q comparators 404. Specifically, the outputs from summers 402-1 and 402-5 are applied as first and second inputs to comparator 404-1; the outputs from summers 402-2 and 402-6 are applied as first and second inputs to comparator 404-2; the outputs from summers 402-3 and 402-7 are applied as first and second inputs to comparator 404-3, and the outputs from summers 402-4 and 402-8 are applied as first and second inputs to comparator 404-4. Each of these comparators passes to its output the lower-valued one of its two (m+1)-bit inputs. The respective outputs from the 4 comparators constitute the output from branch metric computer 304 (i.e., four 5-bit outputs in the assumed case) which are applied as inputs to Viterbi decoder 306.

Structurally, RAM 400 is of a fixed bit storage size having an effective depth of $2^x$ storage locations (i.e., corresponding to locations 1 through 64 in the assumed example in which x=6). Each of the I and Q signal inputs to bank 0 and each of the I and Q signal inputs to bank 1 of RAM 400 has a separate lookup table associated therewith. The width of RAM 400 is sufficient to store four 4m-bit wide (m=4 in the assumed example) precomputed lookup tables, each of which is made up of $2^x$ entries, that have been supplied thereto over the programmable I and Q lookup table control input. Thus, the bit-storage size of RAM 400 is $(2^x)(4)(4m)$ or, in the assumed case, a bit-storage size of 4096 bits. In the case of implementing a punctured QPSK-based code, a simple technique is to pass the maximum I and Q values and store the punctured metrics in appropriate locations in the lookup tables. This necessitates a possible clipping of the actual I and Q data, but can be handled in the front end of decoder 200. Further, the lookup tables can be programmed to permit a desired maximum branch metric value by disregarding certain lesser significant I and Q input data.

As discussed above, branch metric computer 304 is a component of Viterbi-algorithm based convolutional decoder 200 which is used to decode QPSK-based punctured codes for satellite modem operation over a noisy channel and higher alphabet (16, 32, 64, 128 and 256 PAM or QAM or 8-PSK) based rate n/n+1 pragmatic trellis codes for terrestrial or cable operation over a noisy channel. As is known, due to channel noise, the location point of a received demodulated symbol in the I,Q plane will be displaced from its transmitted location point in the I,Q plane. The location point of each successively-received demodulated symbols in the I,Q plane is defined with a resolution of $2^{2x}$ (i.e., 64×64=4096 in the assumed example) by the I and Q signal inputs to RAM 400. The important fact to note about RAM 400 is that its memory requirement is independent of alphabet size.

The 4 m-bit (4-bit in the assumed case) entries of the respective I and Q lookup tables of the 0 bank corresponding to a currently-received demodulated symbol define the respective I and Q components of the respective distances in the I, Q plane of the location points of each of 4 specified valid symbol constellation subsets surrounding the location points of the currently-received demodulated symbol from the location point of this currently-received demodulated symbol.

In the QPSK case, (in which each subset location point defines only a single symbol location point) and in the higher alphabet PAM or QAM cases (in which each subset location point corresponds to the locations of a subset of ¼ of the symbols in that alphabet needed by Viterbi decoder 206, with trellis demapper 310 choosing the correct point within the subset based on delayed, received data applied thereto), a single I component and a single Q component are sufficient to define the four subsets without ambiguity. Therefore, in these cases only bank 0 of RAM 400 is required. However, in the case of 8-PSK, a single I component and a single Q component used independently are insufficient to define four symbol subsets without ambiguity. Therefore, in the 8-PSK case, bank 0 is used to define 0°, 90°, 180°, 270° location points and bank 1 (which operates in a manner similar to that of above-described bank 0) is used to define 45°, 135°, 225°, 315° location points. Comparators 404-1 to 404-4, employing data derived from both bank 0 and bank 1 of RAM 400, are used to resolve this ambiguity in a manner described below.

Summers 402-1 to 402-8 employ the I and Q components of distance to valid constellation location points read out of RAM 400 to compute the so-called Manhattan distance (I+Q) defined by each of the 8 subsets. The Manhattan distance assignment is not the true Euclidean distance $(I^2+Q^2)^{1/2}$, but a distance measure that weights closer points in the I,Q plane more heavily than points in the I,Q plane further away from the received symbol location point. The Manhattan distance metric uses the sum of the differences between the I and Q coordinates of two points in the I, Q two-dimensional space. This distance measure is monotonic with distance, but does weigh points differently depending on their position with respect to the point to which the distance is being computed. However, since the use of the Manhattan distance metric makes the operations on the I and Q coordinates to be decoupled and independent, it drastically reduces the memory requirements of for storing the possible distances from any received location point to a valid constellation location point.

Each of comparators 404-1 to 404-4 is designed to pass the smaller of the two metrics applied from bank 0 and bank 1 as inputs thereto. Thus, in the case of an 8-PSK based code, each of comparators 404-1 to 404-4 will derive as an output either the metric input from bank 0 or from bank 1, depending upon which is smaller. However, in the case of QPSK, PAM or QAM based codes, the I and Q lookup tables stored in bank 1 of RAM 400 are programmed to be filled with maximum-valued metrics so that they are effectively inactive and, therefore, each of comparators 404-1 to 404-4 passes the metric chosen out of bank 0 of RAM 400. In a multi-channel receiver not designed to receive an 8-PSK based code, both these comparators and memory bank 1 of RAM 400 may be eliminated (thereby reducing the required memory storage capacity of RAM 400 in half).

Although the convolutional decoder disclosed herein is primarily for use in a multi-channel television receiver for receiving punctured-coded or pragmatic trellis-coded compressed-digital television data, it is not intended that the type of coded data capable of being decoded by the disclosed convolutional decoder be limited to only television data, but may be employed by any other type of coded data capable of being decoded by the disclosed convolutional decoder.

In addition to being suitable for use in a receiver of satellite, terrestrial and cable television data as mentioned previously, the disclosed decoder apparatus is also suitable for use in other applications including telephone, direct microwave and fiber optic transmission.

What is claimed is:

1. In a system for receiving a modulated signal from multiple types of transmission channels, said signal being representative of compressed digital data coded in one of a plurality of coding formats and exhibiting one of a plurality of modulation formats, a method comprising the steps of:
    selecting a modulation format for demodulation from among modulation formats including QAM and PSK;
    demodulating said modulated signal according to said selected modulation format to produce a demodulated signal;
    selecting a coding format for decoding from among said plurality of coding formats; and
    decoding said demodulated signal according to said selected coding format to produce a demodulated and decoded signal.

2. A method according to claim 1, further including the step of selecting a modulation format for demodulation from among modulation formats including PAM.

3. A method according to claim 1, further including the step of selecting a coding format for decoding from among coding formats including punctured coded and trellis coded formats.

4. A method according to claim 1, wherein said step of selecting a modulation format includes the step of selecting between multiple types of transmission channels including at least two channels from among satellite, cable and terrestrial channels.

5. A method according to claim 1, wherein said PSK modulation format is a QPSK modulation format.

6. In a system for receiving a modulated signal from multiple types of transmission channels, said signal being representative of compressed digital data coded in one of a plurality of coding formats and exhibiting one of a plurality of modulation formats, said multiple types of transmission channels including at least two channels from among satellite, cable and terrestrial channels, signal processing apparatus comprising:
    a demodulator for selectively demodulating said modulated signal from among modulation formats including PAM, QAM and PSK to produce a demodulated signal; and
    a decoder for selectively decoding said demodulated signal from among coding formats including punctured coded and trellis coded formats to produce a demodulated and decoded signal.

7. Apparatus according to claim 6, wherein said data is video information such as television picture information.

8. Apparatus according to claim 6, wherein each format of said plurality of coding formats uses a code rate selected from a plurality of different code rates.

9. Apparatus according to claim 6, wherein said decoder and said demodulator function with variable clock rates.

10. In a system for receiving a modulated signal from multiple types of transmission channels, said signal being representative of compressed digital data coded in one of a plurality of coding formats and exhibiting one of a plurality of modulation formats, a method comprising the steps of:

selecting a modulation format for demodulation from among said plurality of modulation formats;

demodulating said modulated signal according to said selected modulation format to produce a demodulated signal;

selecting a coding format for decoding from among coding formats including punctured coded and trellis coded formats; and decoding said demodulated signal according to said selected coding format to produce a demodulated and decoded signal.

11. A method according to claim 10, further including the step of selecting a modulation format for demodulation from among modulation formats including QAM and PSK.

12. A method according to claim 11, further including the step of selecting a modulation format for demodulation from among modulation formats further including PAM.

13. A method according to claim 11, wherein said PSK modulation format is a QPSK modulation format.

14. A method according to claim 10, wherein said step of selecting a modulation format includes the step of selecting between multiple types of transmission channels including at least two channels from among satellite, cable and terrestrial channels.

* * * * *